US00RE47788E

(19) United States
(12) Reissued Patent
Nakashima et al.

(10) Patent Number: US RE47,788 E
(45) Date of Reissued Patent: Dec. 31, 2019

(54) SPUTTERING TARGET, MANUFACTURING METHOD THEREOF, AND MANUFACTURING METHOD OF SEMICONDUCTOR ELEMENT

(71) Applicants: KABUSHIKI KAISHA TOSHIBA, Tokyo (JP); TOSHIBA MATERIALS CO., LTD., Yokohama-shi, Kanagawa (JP)

(72) Inventors: Nobuaki Nakashima, Kanagawa (JP); Takashi Sano, Fujisawa (JP)

(73) Assignees: KABUSHIKI KAISHA TOSHIBA, Tokyo (JP); TOSHIBA MATERIALS CO., LTD., Yokohama-Shi (JP)

(21) Appl. No.: 16/025,680

(22) Filed: Jul. 2, 2018

Related U.S. Patent Documents

Reissue of:
(64) Patent No.: 9,382,613
Issued: Jul. 5, 2016
Appl. No.: 13/608,406
Filed: Sep. 10, 2012

U.S. Applications:
(63) Continuation of application No. PCT/JP2011/001345, filed on Mar. 8, 2011.

(30) Foreign Application Priority Data

Mar. 11, 2010 (JP) ..... 2010-055100

(51) Int. Cl.
*C23C 14/34* (2006.01)

(52) U.S. Cl.
CPC ..... *C23C 14/3414* (2013.01)

(58) Field of Classification Search
CPC ..... C23C 14/3414
See application file for complete search history.

(56) References Cited

U.S. PATENT DOCUMENTS 3,470,034 A * 9/1969 Kastanek ..... C22F 1/183 148/670
5,204,057 A 4/1993 Ishigami et al.
5,584,906 A 12/1996 Ishigami et al.
5,798,005 A * 8/1998 Murata ..... H01J 37/3426 148/421
5,952,086 A * 9/1999 Ohnishi ..... C22F 1/183 204/192.15

(Continued)

FOREIGN PATENT DOCUMENTS

CN 1592797 3/2005
CN 1592797 A 3/2005

(Continued)

*Primary Examiner* — Alan D Diamond
(74) *Attorney, Agent, or Firm* — Foley & Lardner LLP

(57) ABSTRACT

According to an embodiment, two or more sets of knead forging are performed where one set is cold forging processes in directions parallel to and perpendicular to a thickness direction of a columnar titanium material. The titanium material is heated to a temperature of 700° C. or more to induce recrystallization, and thereafter, two or more sets of knead forging are performed where one set is the cold forging processes in the directions parallel to and perpendicular to the thickness direction. Further, the titanium material is cold rolled, and is heat-treated to a temperature of 300° C. or more.

29 Claims, 2 Drawing Sheets

(56) References Cited

U.S. PATENT DOCUMENTS

| | | | | |
|---|---|---|---|---|
| 6,045,634 | A * | 4/2000 | Annavarapu | C23C 14/3414 148/671 |
| 6,210,634 | B1 | 4/2001 | Ishigami et al. | |
| 6,400,025 | B1 | 6/2002 | Ishigami et al. | |
| 6,723,187 | B2 | 4/2004 | Segal et al. | |
| 6,878,250 | B1 | 4/2005 | Segal et al. | |
| 7,763,126 | B2 | 7/2010 | Takagi et al. | |
| 7,767,043 | B2 | 8/2010 | Segal et al. | |
| 8,029,629 | B2 | 10/2011 | Hukushima | |
| 8,123,875 | B2 | 2/2012 | Takagi et al. | |
| 2001/0023726 | A1 | 9/2001 | Koenigsmann et al. | |
| 2001/0054457 | A1 | 12/2001 | Segal et al. | |
| 2002/0000272 | A1 | 1/2002 | Segal et al. | |
| 2002/0007880 | A1 | 1/2002 | Segal et al. | |
| 2004/0245099 | A1 | 12/2004 | Hukushima | |
| 2007/0023281 | A1 | 2/2007 | Oda | |
| 2009/0020192 | A1 | 1/2009 | Segal et al. | |
| 2010/0059147 | A9 | 3/2010 | Segal et al. | |

FOREIGN PATENT DOCUMENTS

| | | | |
|---|---|---|---|
| JP | 8-232061 | A | 9/1966 |
| JP | 8232061 | | 9/1996 |
| JP | 8-269701 | * | 10/1996 |
| JP | 08-333676 | A | 12/1996 |
| JP | 09-143704 | A | 6/1997 |
| JP | 09-176844 | A | 7/1997 |
| JP | 10-245670 | A | 9/1998 |
| JP | 2000-234167 | A | 8/2000 |
| JP | 2002-220659 | A | 8/2002 |
| JP | 3413782 | B2 * | 4/2003 |
| JP | 2003-253411 | A | 9/2003 |
| JP | 2004-027358 | A | 1/2004 |
| JP | 2005-036291 | A | 2/2005 |
| JP | 2007-302996 | A | 11/2007 |
| KR | 10-0208897 | B1 * | 7/1999 |
| WO | WO 01/44536 | A2 | 6/2001 |
| WO | WO 03/046250 | A1 | 6/2003 |
| WO | WO 2004/011691 | A1 | 2/2004 |
| WO | WO 2005/045090 | A1 | 5/2005 |

* cited by examiner

SPUTTERING TARGET, MANUFACTURING METHOD THEREOF, AND MANUFACTURING METHOD OF SEMICONDUCTOR ELEMENT

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application is *a reissue application of U.S. Pat. No. 9,382,613, which issued on Jul. 5, 2016 from U.S. patent application Ser. No. 13/608,406, filed Sep. 10, 2012, which is herein incorporated in its entirety by reference, which is* a continuation of prior International Application No. PCT/JP2011/001345 filed on Mar. 8, 2011, which is based upon and claims the benefit of priority from Japanese Patent Application No. 2010-055100 filed on Mar. 11, 2010; the entire contents of all of which are incorporated herein by reference.

FIELD

Embodiments described herein relate generally to a sputtering target, a manufacturing method thereof, and a manufacturing method of a semiconductor element.

BACKGROUND

A width of a metal wiring made up of Al, Cu, and so on becomes narrow in accordance with high integration of a semiconductor element. Accordingly, improvement in electromigration (EM) resistance is required. It is desirable to grow a densest surface of a metal crystal in a columnar state when a metal film for wiring is deposited by sputtering to improve the EM resistance. It is also desirable to deposit a barrier film made up of TiN and TaN formed as a base of the metal wiring by the sputtering such that a densest surface thereof similarly grow in the columnar state to enable the above.

A TiN (titanium nitride) film is suitable as the barrier film for an Al wiring. The TiN film is obtained by sputtering a sputtering target made up of, for example, high-purity Ti in a nitrogen atmosphere. It is required to miniaturize a crystal grain size of the metal constituting the sputtering target, and to randomize a crystal orientation to perform the sputtering deposition such that the densest surface of the barrier film becomes the columnar state. Further, for example, it is required to eliminate residues of a cast structure (ghost grain) to improve uniformity of a sputtering film.

In a conventional titanium target, improvement of characteristics is enabled by controlling an impurity amount and a heat conductivity, or controlling a crystal direction. For example, a titanium target of which purity and heat conductivity are increased to enhance the uniformity of the sputtering film is known. Besides, a titanium target of which crystals are oriented in a certain direction to increase a deposition rate is known. On the other hand, the titanium target tends to become large such that a diameter thereof exceeds 300 mm, a thickness thereof becomes 8 mm or more, and so on. This arises from a large sizing of a silicon wafer. It is also required in the large sized titanium target as stated above to increase controllability of the crystal grain size and an orientation state of the crystals. Besides, it is required to increase stability of a sputtering rate.

DETAILED DESCRIPTION

In one embodiment, a manufacturing method of a sputtering target includes: a first knead forging process in which two or more sets of knead forging are performed for a columnar titanium material where one set is cold forging processes in directions parallel to and perpendicular to a thickness direction of the titanium material; a first heat treatment process in which the titanium material passing through the first knead forging process is heated to a temperature of 700° C. or more to induce recrystallization; a second knead forging process in which two or more sets of knead forging are performed for the titanium material passing through the first heat treatment process where one set is cold forging processes in the directions parallel to and perpendicular to the thickness direction of the titanium material; a cold rolling process in which cold rolling is performed for the titanium material passing through the second knead forging process; a second heat treatment process in which the titanium material passing through the cold rolling process is heated to a temperature of 300° C. or more to perform a heat treatment; and a machining process in which the titanium material passing through the second heat treatment process is machined to fabricate a sputtering target.

In another embodiment, a sputtering target is made up of a titanium material of which purity is 99.99 mass % or more and an average crystal grain size is 15 μm or less, and has a sputtering surface. When X-ray diffraction of the sputtering surface is measured, a relative intensity $I_{(100)}$ of a diffraction peak from a (100) plane, a relative intensity $I_{(002)}$ of the diffraction peak from a (002) plane, and a relative intensity $I_{(101)}$ of the diffraction peak from a (101) plane satisfy a condition of $I_{(101)}>I_{(002)}>I_{(100)}$ at the sputtering surface.

Figure 1:
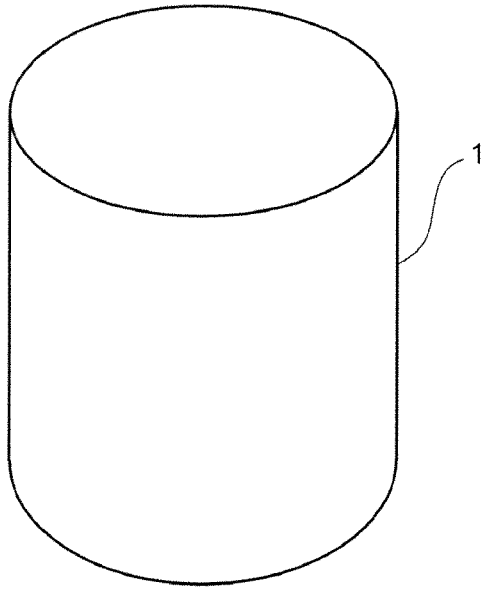
FIG. 1 is a perspective view illustrating a columnar-shaped titanium material used in a manufacturing method according to an embodiment.
Figure 2:
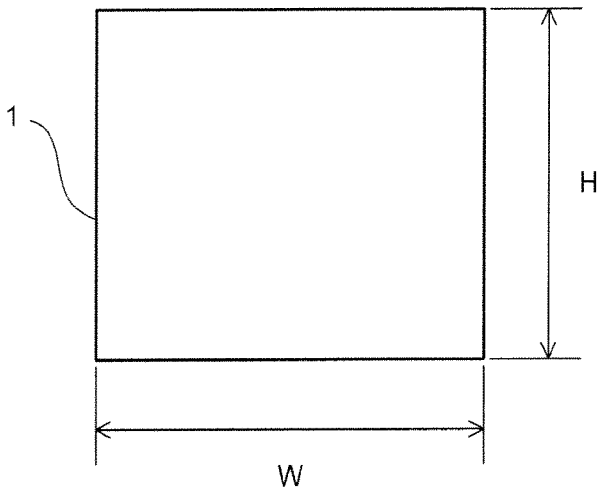
FIG. 2 is a front view of the titanium material illustrated in FIG. 1.

Hereinafter, a sputtering target and a manufacturing method thereof according to an embodiment are described. At first, a titanium material 1 having a columnar shape is prepared as a titanium material as illustrated in FIG. 1. The titanium material 1 is made up of a titanium ingot or a titanium billet. The columnar-shaped titanium material 1 has a diameter W and a thickness H as illustrated in FIG. 2. A size of the titanium material 1 is not particularly limited, but the thickness H is preferable to be within a range of 20 mm to 200 mm, and the diameter W is preferable to be within a range of 100 mm to 300 mm. The titanium material 1 having the size as stated above is easy to treat.

The titanium material 1 is preferable to be the ingot or the billet manufactured by a casting process to which an electron beam (EB) melting method and so on is applied. A purity of the titanium material 1 (titanium purity) is preferable to be 99.99% or more (4N or more). A purity of a sputtering target (titanium target) follows the purity of the titanium material 1, and therefore, it is preferable to use the titanium material 1 of which purity is 99.99% or more when the sputtering target of which purity is 99.99% or more is manufactured. When the sputtering target of which purity is 99.999% or more (5N or more) is manufactured, it is preferable to use the titanium material 1 of which purity is 99.999% or more.

In the manufacturing method of the sputtering target according to the embodiment, a first knead forging process is performed in which two or more sets of knead forging, where one set is cold forging processes in directions parallel to and perpendicular to a thickness direction of the columnar-shaped titanium material 1 are performed for the titanium material 1. The direction parallel to the thickness direction of the titanium material 1 is the thickness H direction in FIG. 2, and the direction perpendicular to the thickness direction is the diameter W direction in FIG. 2. When the knead forging including the cold forging in the thickness H direction and the cold forging in the diameter W direction is set to be one set, this set is performed for two or more sets.

In the knead forging, pressures are added from different directions, and therefore, it is possible to miniaturize a crystal grain size of the titanium material 1, and to suppress that a crystal direction becomes unbalance in a certain direction. Further, it is possible to suppress occurrence of residues of a cast structure of the titanium material 1 manufactured by casting, namely, occurrence of so-called a ghost grain. The more the number of times of the knead forging is, the better. However, not only manufacturing cost increases but also cracks, wrinkles, and so on of the material are easy to occur when the number of times is too much. Accordingly, it is preferable to set the number of times of the knead forging to be two sets to four sets.

Vickers hardness (average value) of the titanium material 1 passing through the first knead forging process is preferable to be Hv 170 or more. Homogeneity of a structure improves and the hardness of the titanium material 1 increases by performing the knead forging for two or more sets. When a post process is considered, further effect cannot be obtained if the Vickers hardness of the titanium material 1 is set to be less than Hv 170, and the knead forging is performed in vain. Accordingly, it is preferable to perform the first knead forging process such that the Vickers hardness of the titanium material 1 becomes Hv 170 or more when the number of sets of the first knead forging is controlled.

Figure 3:
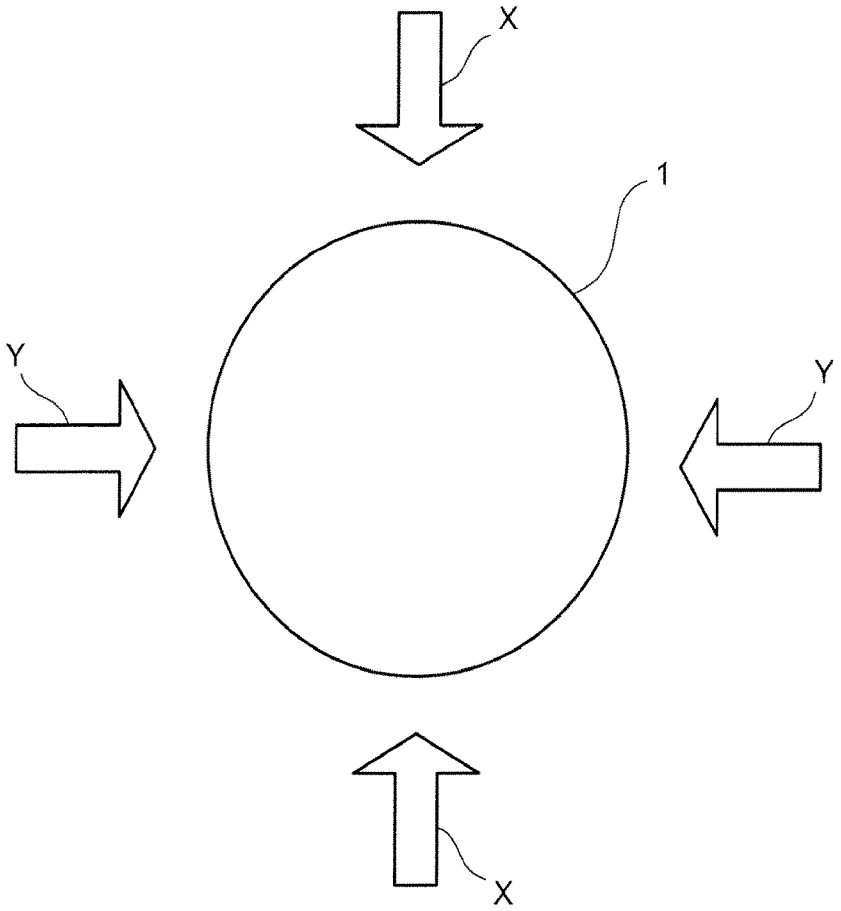
FIG. 3 is a plan view illustrating a process direction for the titanium material illustrated in FIG. 1.

The cold forging process in the diameter W direction is preferable to be performed while changing directions to which the pressures are added such that, for example, the pressure is added in a direction of an arrow X for the first set, and the pressure is added in a direction of an arrow Y for the second set, and so on as illustrated in FIG. 3 without constantly adding the pressures in a certain direction. It is effective to change the directions of adding pressures within one set. It is possible to increase the miniaturizing effect of the crystal grain size of the titanium material 1 and the suppression effect of the unbalance of the crystal direction by changing the directions of the pressures to be added in the cold forging process in the diameter W direction. The first knead forging process is performed by the cold forging. When a hot forging is performed, a surface crack is easy to occur caused by oxidation. Further, a grain growth of crystal occurs and therefore, the minute crystal structure cannot be obtained.

Next, a first heat treatment process is performed in which the titanium material 1 passing through the first knead forging process is heated to a temperature of 700° C. or more to induce recrystallization. The first heat treatment process is performed, and thereby, an internal strain generated at the titanium material 1 by the first knead forging process is removed, further the recrystallization is induced, and the uniform and minute crystal structure is obtained. The first heat treatment process is preferable to be performed by keeping at a temperature within a range of 700° C. to 1000° C. for 0.5 hours to 10 hours. When the heat treatment temperature exceeds 1000° C. or the heat treatment time exceeds 10 hours, there is a possibility in which the grain growth occurs. The heat treatment temperature is more preferable to be within a range of 800° C. to 900° C. The heat treatment time is more preferable to be within a range of 1 hour to 5 hours. An atmosphere at the heat treatment time is preferable to be a vacuum atmosphere of 0.133 Pa or less. There is a possibility in which a surface of the titanium material 1 is oxidized during the heat treatment in an oxygen-containing atmosphere.

Next, a second knead forging process is performed in which the knead forging is performed for the titanium material 1 passing through the first heat treatment process. The two or more sets of the knead forging, where one set is the cold forging processes in the thickness H direction and the diameter W direction are performed also in the second knead forging process as same as the first knead forging process. The knead forging is preferable to be performed for two sets to four sets also in the second knead forging process. Besides, it is preferable to change the pressurizing direction added in the diameter W direction in the first set and the second set. The second knead forging process is also performed by the cold forging. It is possible to further promote the miniaturization of the crystal grain size by the second knead forging process.

Next, a cold rolling process is performed in which the titanium material 1 passing through the second knead forging process is cold rolled. The cold rolling process is a process performing a plastic working for the titanium material 1 into a plate state. The cold rolling process may be performed twice or more according to need. It is preferable to make a plate thickness of the titanium material 1 into 20 mm or less, further at 10 mm to 15 mm by the cold rolling process. A cutting and so on is performed for the titanium material 1 having the plate thickness prepared by the cold rolling process, and it is made to be a sputtering target having a desired plate thickness. The heat treatment process is not to be performed between the second knead forging process and the cold rolling process. It is preferable to perform the cold rolling for the titanium material 1 as it is which is homogenized by the second knead forging process.

Working ratios in the first knead forging process, the second knead forging process, and the cold rolling process are arbitrary, but it is preferable that at least one process selected from the first knead forging process, the second knead forging process and the cold rolling process is performed such that the working ratio thereof becomes 40% or more. The working ratio in the first and second knead forging processes is a reduction ratio in cross section (reduction in area) in the diameter W direction of the columnar titanium material 1, or a reduction ratio in the thickness H direction (reduction in thickness) of the columnar titanium material 1, and each represents the reduction ratio (working ratio) of the cross section or the thickness per one set. The working ratio in the cold rolling process is the reduction ratio in the thickness H direction (reduction in thickness) of the columnar titanium material 1.

The process of which working ratio is 40% or more is the cold process. For example, it is possible to suppress the occurrence of the internal strain even if the cold rolling of which working ratio is 40% or more is performed after the first knead forging process, the first heat treatment process and the second knead forging process are performed. When the working ratio is low, the occurrence of the internal strain is suppressed, but each process may be repeated again and again to thereby increase the manufacturing time and the manufacturing cost. Accordingly, it is preferable that the working ratio is set to be 40% or more at any of the processes. The process of which working ratio is 40% or more may be any one, two, or all of the processes of the first knead forging process, the second knead forging process and the cold rolling process. An upper limit of the working ratio is preferable to be 80% or less. When the working ratio of one process exceeds 80%, the internal strain, the cracks, the wrinkles, and so on are easy to occur.

Next, a second heat treatment process is performed in which the titanium material 1 passing through the cold rolling process is heated to a temperature of 300° C. or more to be heat treated. The second heat treatment process is preferable to be performed by keeping at a temperature within a range of 300° C. to 600° C. for 2 hours to 5 hours. The heat treatment temperature is more preferable to be within a range of 400° C. to 600° C. Besides, the atmosphere at the heat treatment time is preferable to be the vacuum atmosphere of 0.133 Pa or less. There is a possibility in which the surface of the plate state titanium material is oxidized during the heat treatment in the oxygen-containing atmosphere. The second heat treatment process is performed, and thereby, the internal strain generated by the second knead forging process and the cold rolling process is removed, further the recrystallization is induced, and the uniform microcrystalline structure is obtained. Specifically, the titanium material having the minute crystal structure of which average crystal grain size is 15 μm or less is obtained.

Subsequently, the sputtering target is manufactured by machining the plate state titanium material passing through the second heat treatment process. The machining of the plate state titanium material is performed by the cutting such as a lathing. The machining as stated above is performed to thereby arrange the shape of the plate state titanium material into a desired target shape, and an aimed sputtering target is obtained. The obtained sputtering target is bonded to a backing plate by a diffusion bonding.

According to the manufacturing method of this embodiment, the crystal grain size is miniaturized and the unbalance of the crystal direction is suppressed by the first and second knead forging processes. Accordingly, it is possible to obtain the sputtering target (titanium target) in which both the minute crystal structure of which average crystal grain size is 15 μm or less and the random crystal orientation are enabled with repeatability. Further, it is possible to obtain the sputtering target of which purity is 99.99% or more and having the microcrystalline structure and the random orientation by using the titanium material of which purity is high. Besides, it is possible to obtain the minute crystal structure without the ghost grain being the residues of the cast structure. When the ghost grain exists, a part which is not the random orientation is partially generated.

In particular, it is possible to obtain the minute crystal structure of which average crystal grain size is 15 μm or less and the crystal orientation is made to be the random orientation also in a thick sputtering target of which thickness is 10 mm or more and in a large sputtering target of which diameter is 300 mm or more. Further, according to the manufacturing method of the embodiment, the sputtering target of which Vickers hardness of the sputtering surface is Hv 90 to Hv 100, and a dispersion of the Vickers hardness is 3% or less can be obtained. Namely, a homogeneous state can be obtained by combining the knead forging and the heat treatment. Namely, the titanium material of which Vickers hardness becomes hard such as Hv 170 or more by the knead forging is able to be made soften (Hv 90 to Hv 110) by the heat treatment. The sputtering target having the minute and homogenous structure can be obtained by repeating the processes as stated above.

The average crystal grain size is measured by a line intercept method. The line intercept method is performed as described below. At first, a macrophotograph of a measuring object part is photographed by an optical microphotography. The macrophotograph is a photograph expanding a part of a unit area of 500 μm×500 μm. An arbitrary line (a length for 500 μm) is drawn in the macrophotograph as stated above, the number of Ti crystal grains existing on the line is counted, and the average crystal grain size is found by "500 μm/the number of crystal grains existing on the line of 500 μm". The operations as stated above are performed for three times, and an average value of the measurement values are set to be the average crystal grain size.

In the sputtering target according to this embodiment, the crystal orientation of the sputtering surface is the random orientation, and the random orientation is maintained for a whole area in the thickness direction of the sputtering target. Therefore, it is possible to suppress the change of the sputtering rate at the sputtering time. Accordingly, it becomes possible to perform the uniform deposition. It is possible to grow the densest surface in the columnar state when a titanium nitride (TiN) film is deposited by sputtering in, for example, a nitrogen atmosphere by using the sputtering target of this embodiment. The titanium nitride film as stated above is suitable for a barrier film and so on of a wiring layer (Al wiring and so on) of a semiconductor element.

The random crystal orientation is able to be measured by an X-ray diffractometry (XRD). In the titanium target in the random orientation, a relative intensity $I_{(100)}$ of a diffraction peak from a (100) plane of titanium, a relative intensity $I_{(002)}$ of the diffraction peak from a (002) plane of titanium, and a relative intensity $I_{(101)}$ of the diffraction peak from a (101) plane of titanium become small in an order of $I_{(101)}>I_{(002)}>I_{(100)}$ when an X-ray diffraction (2θ) of the sputtering surface is measured. It is verified that the titanium target is the random orientation when a condition as stated above is satisfied. When the crystals are oriented in a certain direction, an order of a relative intensity ratio of each crystal plane changes.

Further, in the sputtering target of this embodiment, the random orientation of the crystals is also maintained in the thickness direction, and therefore, the order of the relative intensity ratio of each crystal plane becomes similar when the X-ray diffraction (2θ) of a part parallel to the sputtering surface in a depth direction is measured. Namely, when the X-ray diffraction in the depth direction is measured, the relative intensity $I_{(100)}$ of the diffraction peak from the (100) plane of titanium, the relative intensity $I_{(002)}$ of the diffraction peak from the (002) plane of titanium, and the relative intensity $I_{(101)}$ of the diffraction peak from the (101) plane of titanium becomes small in an order of $I_{(101)}>I_{(002)}>I_{100)}$.

In the X-ray diffractometry, peaks of the crystal planes other than the (100) plane, the (002) plane, the (101) plane are detected, but it is important to compare the relative intensities of respective peaks of the (100) plane, the (002) plane, and the (101) plane to determine whether or not it is the random orientation. The reason is that the peaks of these planes are three major peaks with the highest intensities in PDF data. Note that measurement conditions of the X-ray diffractometry are a Cu target, a tube voltage of 40 kV, a tube current of 40 mA, a scattering slit of 0.63 mm, and a light-receiving slit of 0.15 mm.

It is possible to determine as for presence/absence of the ghost grain at the sputtering target (titanium target) by the above-stated X-ray diffractometry. When the ghost grain exists, apart where the condition of "$I_{(101)}>I_{(002)}>I_{(100)}$" is not satisfied exists. The presence/absence of the ghost grain is able to be determined by the macrophotograph obtained by an optical microscope. When the ghost grain exists in the macrophotograph (structure photograph) by the optical microscope, a structure of which grain boundary of Ti crystal grain is unclear is recognized.

In the sputtering target (titanium target) of this embodiment, the random orientation of the sputtering surface is maintained in the thickness direction. Accordingly, the change of the sputtering rate is difficult to occur, and the sputtering characteristics with high reliability are represented even if a sputtering target of which thickness is thick to be 10 mm or more is sputtered for a long time. Besides, it is possible to maintain the average crystal grain size of 15 μm or less and the homogeneous random orientation even in a large sputtering target of which diameter of the sputtering surface is 300 mm or more. Accordingly, it is possible to obtain the uniform state in which the Vickers hardness of the sputtering surface is Hv 90 to Hv 110, and the dispersion of the Vickers hardness is 3% or less.

Further, it is possible to maintain the minute crystal structure of which average crystal grain size is 15 μm or less and the homogeneous random orientation in the thickness direction even in the thick sputtering target and the large sputtering target as stated above. In addition, the residues of the ghost grain are able to be eliminated. Accordingly, the change of the sputtering rate is difficult to occur even when the sputtering target is used for a long time in the deposition process. Accordingly, it is possible to provide a stable sputtering until the thickness of the sputtering target becomes approximately 2 mm. A remaining part of the sputtering target is reused, but a cost for remelting increases if the remaining part is large. Accordingly, it is preferable that the target part to be the remaining part is smaller.

A manufacturing method of a semiconductor element according to the embodiment includes a process performing sputtering deposition of a thin film containing titanium by using the sputtering target according to the above-stated embodiment. The deposition process is a process depositing the titanium nitride film by, for example, sputtering the sputtering target (titanium target) in nitrogen. The titanium nitride film deposited by using the sputtering target of this embodiment is suitable as the barrier film of the semiconductor element. According to the sputtering target of this embodiment, it becomes possible to improve reliability of the semiconductor element because the reliability is able to be maintained even when it is used for a long time.

Next, examples and evaluation results thereof are described.

EXAMPLES 1 TO 5, COMPARATIVE EXAMPLE 1

A titanium material (high-purity titanium billet of which purity is 99.99 mass % or more) of which diameter W is 100 mm to 300 mm, thickness H is 100 mm to 200 mm is prepared, and a manufacturing process of a sputtering target of which conditions are each represented in Table 1 is performed. Note that the working ratio of the knead forging process in Table 1 represents a larger value between the reduction in area in the diameter W direction and the reduction in thickness in the thickness H direction. The first and second knead forging processes are performed such that at least one of the reduction in area and the reduction in thickness becomes the working ratio represented in Table 1.

TABLE 1

| | First Knead Forging | | | Second Knead Forging | | Cold Rolling | | |
|---|---|---|---|---|---|---|---|---|
| | Number of times | Working Ratio (%) | First Heat Treatment | Number of times | Working Ratio (%) | Number of times | Working Ratio (%) | Second Heat Treatment |
| Example 1 | 2 | 40 | 800° C. × 6 h | 2 | 30 | 1 | 45 | 350° C. × 4 h |
| Example 2 | 2 | 50 | 800° C. × 4 h | 2 | 50 | 1 | 50 | 400° C. × 3 h |
| Example 3 | 3 | 50 | 850° C. × 3 h | 2 | 70 | 2 | 60 | 450° C. × 3 h |
| Example 4 | 2 | 30 | 900° C. × 2 h | 3 | 50 | 3 | 70 | 500° C. × 3 h |
| Example 5 | 4 | 30 | 800° C. × 5 h | 2 | 50 | 2 | 50 | 450° C. × 4 h |
| Comparative Example 1 | 1 | 30 | 800° C. × 3 h | 1 | 30 | 1 | 50 | 600° C. × 4 h |

The lathing is performed for the titanium material obtained by the manufacturing process represented in Table 1 to manufacture the titanium targets of which sizes are represented in Table 2. The average crystal grain size of each target is measured, and further the presence/absence of the random orientation is verified. The average crystal grain size is measured by the above-stated method. Results thereof are represented in Table 2. The presence/absence of the random orientation is determined by performing the X-ray diffraction at the sputtering surface and at a part dug to a depth of 10 mm from the sputtering surface, and measuring the relative intensities of the diffraction peaks from the (100) plane, the (002) plane and the (101) plane at each measurement point. The order of the relative intensities of the diffraction peaks from each crystal plane is represented in Table 2. All of the titanium targets have a recrystallization structure.

TABLE 2

| | Target size [diameter × thickness] (mm) | Average Crystal Grain Size (μm) | X-ray Diffraction (order of relative intensity ratio) Sputtering Surface | Depth 10 mm |
|---|---|---|---|---|
| Example 1 | 320 × 13 | 7 | (101) > (002) > (100) | (101) > (002) > (100) |
| Example 2 | 320 × 18 | 8 | (101) > (002) > (100) | (101) > (002) > (100) |

TABLE 2-continued

| | Target size [diameter × thickness] (mm) | Average Crystal Grain Size (μm) | X-ray Diffraction (order of relative intensity ratio) Sputtering Surface | Depth 10 mm |
|---|---|---|---|---|
| Example 3 | 400 × 15 | 8 | (101) > (002) > (100) | (101) > (002) > (100) |
| Example 4 | 400 × 15 | 9 | (101) > (002) > (100) | (101) > (002) > (100) |
| Example 5 | 450 × 12 | 10 | (101) > (002) > (100) | (101) > (002) > (100) |
| Comparative Example 1 | 320 × 13 | 12 | (002) > (101) > (100) | (002) > (101) > (100) |

Next, the backing plate is bonded to each of the titanium targets (sputtering targets) according to the examples and the comparative example by the diffusion bonding, and thereafter, the titanium nitride film is deposited by performing the sputtering in the nitrogen atmosphere. At that time, the presence/absence of the ghost grain at an erosion surface after the sputtering is verified. Results thereof are represented in Table 3.

TABLE 3

| | Presence/Absence of Ghost Grain After Sputtering |
|---|---|
| Example 1 | Absent |
| Example 2 | Absent |
| Example 3 | Absent |
| Example 4 | Absent |
| Example 5 | Absent |
| Comparative Example 1 | Present |

None of the titanium targets according to the examples 1 to 5 has the ghost grain, and the stable sputtering characteristics are represented until a remaining thickness becomes 2 mm. The ghost grain is verified at a depth of 5 mm in the titanium target of the comparative example. It turns out from the results that the titanium targets according to the examples represent the sputtering characteristics with high reliability. Accordingly, it becomes possible to improve reliability of a semiconductor element by forming a barrier film (TiN film) of the semiconductor element by using the titanium target according to the example. Further, it is possible to reduce the amount of reused (remelted) titanium, and therefore, the titanium targets according to the examples are excellent in material efficiency.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A sputtering target made up of a titanium material of which purity is 99.99 mass % or more and an average crystal grain size is 15 μm or less, wherein the sputtering target has a surface to be sputtered, and wherein, when X-ray diffraction of the surface is measured, a relative intensity $I_{(100)}$ of a diffraction peak from a (100) plane, a relative intensity $I_{(002)}$ of a diffraction peak from a (002) plane, and a relative intensity $I_{(101)}$ of a diffraction peak from a (101) plane satisfy a condition of $I_{(101)}>I_{(002)}>I_{(100)}$ at the surface, wherein, when X-ray diffraction at a part parallel to the surface in a depth direction of the sputtering target is measured, the relative intensity $I_{(100)}$, the relative intensity $I_{(002)}$, and the relative intensity $I_{(101)}$ satisfy a condition of $I_{(101)}>I_{(002)}>I_{(100)}$, and wherein a ghost grain does not exist in the sputtering target.

[2. The sputtering target according to claim 1, wherein a crystal orientation of the sputtering surface is a random orientation.]

3. The sputtering target according to claim 1, wherein a thickness of the sputtering target is 10 mm or more.

4. The sputtering target according to claim 1, wherein a diameter of the sputtering target is 300 mm or more.

*5. A target, comprising:*

*a titanium component having a surface to be sputtered and having a thickness portion and a diameter portion perpendicular to the thickness portion,*

*wherein a uniform microcrystalline structure defines the titanium component,*

*wherein at least the thickness portion comprises crystal grains in a random orientation,*

*wherein, when X-ray diffraction of the surface of the titanium component to be sputtered is measured, a relative intensity $I_{(100)}$ of a diffraction peak from a (100) plane, a relative intensity $I_{(002)}$ of a diffraction peak from a (002) plane, and a relative intensity $I_{(101)}$ of a diffraction peak from a (101) plane satisfy a condition of $I_{(101)}>I_{(002)}>I_{(100)}$ at the surface,*

*wherein, when X-ray diffraction at a part parallel to the surface in a depth direction of the titanium component is measured, the relative intensity $I_{(100)}$, the relative intensity $I_{(002)}$, and the relative intensity $I_{(101)}$ satisfy a condition of $I_{(101)}>I_{(002)}>I_{(100)}$,*

*wherein the titanium component lacks ghost grains, and*

*wherein an average crystal grain size of the titanium component is 15 μm or less.*

*6. The target of claim 5, wherein an average crystal grain size of the titanium component is 10 μm or less.*

*7. The target of claim 5, wherein an average crystal grain size of the titanium component is at least 7 μm and no more than 10 μm.*

*8. A target made up of a titanium material of which purity is 99.999 mass % or more,*

*wherein the target has a surface to be sputtered, and*

*wherein, when X-ray diffraction of the surface is measured, a relative intensity $I_{(100)}$ of a diffraction peak from a (100) plane, a relative intensity $I_{(002)}$ of a diffraction peak from a (002) plane, and a relative intensity $I_{(101)}$ of a diffraction peak from a (101) plane satisfy a condition of $I_{(101)}>I_{(002)}>I_{(100)}$ at the surface,*

*wherein, when X-ray diffraction at a part parallel to the surface in a depth direction of the target is measured,*

*the relative intensity $I_{(100)}$, the relative intensity $I_{(002)}$, and the relative intensity $I_{(101)}$ satisfy a condition of $I_{(101)}>I_{(002)}>I_{(100)}$,*

*wherein a ghost grain does not exist in the target, and*

*wherein an average crystal grain size of the titanium material is 15 μm or less.*

*9. The target of claim 8, wherein a diameter of the target is 320-450 mm.*

*10. The target of claim 8, wherein a thickness of the target is 12-18 mm.*

*11. The target of claim 8, wherein a Vickers hardness of the titanium is Hv 90 to Hv 110.*

*12. The target of claim 11, wherein a dispersion of the Vickers hardness of the surface to be sputtered is 3% or less.*

*13. The sputtering target of claim 1, wherein a Vickers hardness of the titanium is Hv 90 to Hv 110.*

*14. The sputtering target of claim 13, wherein a dispersion of the Vickers hardness of the surface to be sputtered is 3% or less.*

*15. The sputtering target of claim 3, wherein a Vickers hardness of the titanium is Hv 90 to Hv 110.*

*16. The sputtering target of claim 15, wherein a dispersion of the Vickers hardness of the surface to be sputtered is 3% or less.*

*17. The sputtering target of claim 4, wherein a Vickers hardness of the titanium is Hv 90 to Hv 110.*

*18. The sputtering target of claim 17, wherein a dispersion of the Vickers hardness of the surface to be sputtered is 3% or less.*

*19. A target, comprising:*

*a titanium component having a surface to be sputtered and having a thickness portion and a diameter portion perpendicular to the thickness portion,*

*wherein a uniform microcrystalline structure defines the titanium component,*

*wherein at least the thickness portion comprises crystal grains in a random orientation,*

*wherein, when X-ray diffraction of the surface of the titanium component to be sputtered is measured, a relative intensity $I_{(100)}$ of a diffraction peak from a (100) plane, a relative intensity $I_{(002)}$ of a diffraction peak from a (002) plane, and a relative intensity $I_{(101)}$ of a diffraction peak from a (101) plane satisfy a condition of $I_{(101)}>I_{(002)}>I_{(100)}$ at the surface,*

*wherein, when X-ray diffraction at a part parallel to the surface in a depth direction of the titanium component is measured, the relative intensity $I_{(100)}$, the relative intensity $I_{(002)}$, and the relative intensity $I_{(101)}$ satisfy a condition of $I_{(101)}>I_{(002)}>I_{(100)}$,*

*wherein the titanium component lacks ghost grains, and*

*wherein a Vickers hardness of the titanium is Hv 90 to Hv 110.*

*20. The target according to claim 19, wherein a thickness of the target is 10 mm or more.*

*21. The target of claim 19, wherein a dispersion of the Vickers hardness of the surface of the titanium component to be sputtered is 3% or less.*

*22. A target, comprising:*

*a titanium component having a surface to be sputtered and having a thickness portion and a diameter portion perpendicular to the thickness portion,*

*wherein a uniform microcrystalline structure defines the titanium component,*

*wherein at least the thickness portion comprises crystal grains in a random orientation,*

*wherein, when X-ray diffraction of the surface of the titanium component to be sputtered is measured, a relative intensity $I_{(100)}$ of a diffraction peak from a (100) plane, a relative intensity $I_{(002)}$ of a diffraction peak from a (002) plane, and a relative intensity $I_{(101)}$ of a diffraction peak from a (101) plane satisfy a condition of $I_{(101)}>I_{(002)}>I_{(100)}$ at the surface,*

*wherein, when X-ray diffraction at a part parallel to the surface in a depth direction of the titanium component is measured, the relative intensity $I_{(100)}$, the relative intensity $I_{(002)}$, and the relative intensity $I_{(101)}$ satisfy a condition of $I_{(101)}>I_{(002)}>I_{(100)}$,*

*wherein the titanium component lacks ghost grains, and*

*wherein a diameter of the sputtering target is 300 mm or more.*

*23. The target according to claim 22, wherein a Vickers hardness of the titanium is Hv 90 to Hv 110.*

*24. The target of claim 23, wherein a dispersion of the Vickers hardness of the surface of the titanium component to be sputtered is 3% or less.*

*25. A target made up of a titanium material of which purity is 99.999 mass % or more,*

*wherein the target has a surface to be sputtered, and*

*wherein, when X-ray diffraction of the surface is measured, a relative intensity $I_{(100)}$ of a diffraction peak from a (100) plane, a relative intensity $I_{(002)}$ of a diffraction peak from a (002) plane, and a relative intensity $I_{(101)}$ of a diffraction peak from a (101) plane satisfy a condition of $I_{(101)}>I_{(002)}>I_{(100)}$ at the surface,*

*wherein, when X-ray diffraction at a part parallel to the surface in a depth direction of the target is measured, the relative intensity $I_{(100)}$, the relative intensity $I_{(002)}$, and the relative intensity $I_{(101)}$ satisfy a condition of $I_{(101)}>I_{(002)}>I_{(100)}$,*

*wherein a ghost grain does not exist in the target, and*

*wherein a Vickers hardness of the titanium is Hv 90 to Hv 110.*

*26. The target according to claim 25, wherein a thickness of the target is 10 mm or more.*

*27. The target of claim 25, wherein a dispersion of the Vickers hardness of the surface to be sputtered is 3% or less.*

*28. A target made up of a titanium material of which purity is 99.999 mass % or more,*

*wherein the target has a surface to be sputtered, and*

*wherein, when X-ray diffraction of the surface is measured, a relative intensity $I_{(100)}$ of a diffraction peak from a (100) plane, a relative intensity $I_{(002)}$ of a diffraction peak from a (002) plane, and a relative intensity $I_{(101)}$ of a diffraction peak from a (101) plane satisfy a condition of $I_{(101)}>I_{(002)}>I_{(100)}$ at the surface,*

*wherein, when X-ray diffraction at a part parallel to the surface in a depth direction of the target is measured, the relative intensity $I_{(100)}$, the relative intensity $I_{(002)}$, and the relative intensity $I_{(101)}$ satisfy a condition of $I_{(101)}>I_{(002)}>I_{(100)}$,*

*wherein a ghost grain does not exist in the target, and*

*wherein a diameter of the sputtering target is 300 mm or more.*

*29. The target of claim 28, wherein a Vickers hardness of the titanium is Hv 90 to Hv 110.*

*30. The target of claim 29, wherein a dispersion of the Vickers hardness of the surface of the titanium component to be sputtered is 3% or less.*

* * * * *